(12) United States Patent
Takimoto

(10) Patent No.: US 9,281,220 B2
(45) Date of Patent: Mar. 8, 2016

(54) LIQUID PROCESSING APPARATUS, LIQUID PROCESSING METHOD AND STORAGE MEDIUM

(71) Applicant: Tokyo Electron Limited, Tokyo (JP)

(72) Inventor: Yuuji Takimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 556 days.

(21) Appl. No.: 13/649,263

(22) Filed: Oct. 11, 2012

(65) Prior Publication Data

US 2013/0092195 A1 Apr. 18, 2013

(30) Foreign Application Priority Data

Oct. 13, 2011 (JP) ................. 2011-225847

(51) Int. Cl.
*H01L 21/67* (2006.01)
(52) U.S. Cl.
CPC .... *H01L 21/67051* (2013.01); *H01L 21/67276* (2013.01)
(58) Field of Classification Search
None
See application file for complete search history.

(56) References Cited

U.S. PATENT DOCUMENTS

| | | | |
|---|---|---|---|
| 2004/0050491 A1* | 3/2004 | Miya et al. | 156/345.11 |
| 2010/0108103 A1* | 5/2010 | Minami et al. | 134/26 |

FOREIGN PATENT DOCUMENTS

| | | | | |
|---|---|---|---|---|
| JP | 11-265871 | A | | 9/1999 |
| JP | 11265871 | A | * | 9/1999 |
| JP | 2001-212493 | A | | 8/2001 |
| JP | 2001212493 | A | * | 8/2001 |
| JP | 2002-307005 | A | | 10/2002 |
| JP | 2007-035866 | A | | 2/2007 |
| JP | 2007-263485 | A | | 10/2007 |
| JP | 2009-252855 | A | | 10/2009 |
| JP | 2010-109347 | A | | 5/2010 |
| JP | 2010109347 | A | * | 5/2010 |

\* cited by examiner

*Primary Examiner* — Nicole Blan
(74) *Attorney, Agent, or Firm* — Abelman, Frayne & Schwab

(57) ABSTRACT

Disclosed are a liquid processing device, and a liquid processing method. The liquid processing method includes a first process that includes supplying a first processing liquid to the substrate and discharging the first processing liquid within the processing space from a first discharge path, a second process that includes supplying a second processing liquid to the substrate and discharging the second processing liquid within the processing space from the second discharge path, and after stop supplying of the first processing liquid and prior to beginning of the second process, a nozzle switching operation switching from the first nozzle to the second nozzle and a discharge mechanism switching operation switching from the first discharge path to the second discharge path are performed. A longer one of a time to switch the nozzle and a time to switch the discharge mechanism is determined as a maximum preparation time and the switching operations begin at an earlier time than the completion time of the first process by the maximum preparation time or more.

11 Claims, 5 Drawing Sheets

(a)

(b)

LIQUID PROCESSING APPARATUS, LIQUID PROCESSING METHOD AND STORAGE MEDIUM

CROSS-REFERENCE TO RELATED APPLICATIONS

This application is based on and claims priority from Japanese Patent Application No. 2011-225847, filed on Oct. 13, 2011, with the Japanese Patent Office, the disclosure of which is incorporated herein in its entirety by reference.

TECHNICAL FIELD

The present disclosure relates to a liquid processing apparatus and a liquid processing method that perform a predetermined liquid processing such as a cleaning or an etching on a substrate by supplying a processing liquid to the substrate while rotating the substrate held in a horizontal state, and a storage medium having a program for executing the liquid processing method recorded therein.

BACKGROUND

In a manufacturing process of a semiconductor device, a resist film is formed in a predetermined pattern on a film to be processed formed on a substrate (hereinafter, also referred to as "wafer") such as a semiconductor wafer, and a processing such as an etching or an ion injection is performed on the film using the resist film as a mask. After the processing, the resist film which becomes unnecessary is removed from the wafer.

As a removal method of the resist film, the process using Sulfuric Acid Hydrogen Peroxide Mixture (SPM) is frequently used. The SPM process is performed by supplying a high temperature SPM liquid obtained by mixing sulfuric acid having been heated and a hydrogen peroxide to the resist film on the wafer from a SPM liquid supply nozzle. In this case, the wafer is held by the substrate holding unit and the SPM liquid supplied to the wafer is discharged from a first discharge path provided on an outer periphery of the substrate holding unit.

After the SPM process is completed, a rinsing liquid is supplied to the wafer from a rinsing liquid supply nozzle. In this case, the rinsing liquid supplied to the wafer is discharged from a second discharge path other than the first discharge path.

Meanwhile, a switching operation of switching from the SPM liquid supply nozzle (a first nozzle) to the rinsing liquid supply nozzle (a second nozzle) as well as a switching operation from a path that guides the liquid discharged from the wafer to a first discharge path to another path that guides the liquid discharged from the wafer to a second discharge path, are needed between a process of supplying the SPM liquid (a first processing liquid) to the wafer and a process of supplying the rinsing liquid (a second processing liquid) to the wafer.

Therefore, a processing time is the sum of a time to supply the SPM liquid (the first processing liquid) to the wafer, a time to supply the rinsing liquid (the second processing liquid) to the wafer, a time to switch from the SPM liquid supply nozzle (a first nozzle) to the rinsing liquid supply nozzle (a second nozzle) and a time to switch from the first discharge path to the second discharge path. Under the circumstances, the entire processing time needs to be much shorter in the recent manufacturing process of semiconductor devices.

See, for example, Japanese Patent Laid-Open Publication No. 2007-35866

SUMMARY

An exemplary embodiment of the present disclosure provides a liquid processing apparatus, which includes: a substrate holding unit holding a substrate within a processing space, a first nozzle configured to supply a first processing liquid to the substrate held in the substrate holding unit, a second nozzle configured to supply a second processing liquid to the substrate held in the substrate holding unit, a discharge mechanism capable of switching between a first discharge path and a second path, and a control unit configured to control each of the substrate holding unit, the first nozzle, the second nozzle and the discharge mechanism, respectively. In particular, the control unit performs a first process in which the first processing liquid is supplied to the substrate held in the substrate holding unit and discharged from the first discharge path through the discharge mechanism, a second process, after the first process, in which the second processing liquid is supplied to the substrate held in the substrate holding unit and discharged from the second discharge path through the discharge mechanism, and prior to beginning of the second process, a nozzle switching operation switching from the first nozzle to the second nozzle and a switching operation of a discharge mechanism switching from the first discharge path to the second discharge path. Further, the control unit determines a longer one of a time required to perform the nozzle switching operation and a time required to perform the discharge mechanism switching operation as a maximum preparation time and begins the nozzle switching operation and the discharge mechanism switching operation at an earlier time than the completion time of the first process by the maximum preparation time or more.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
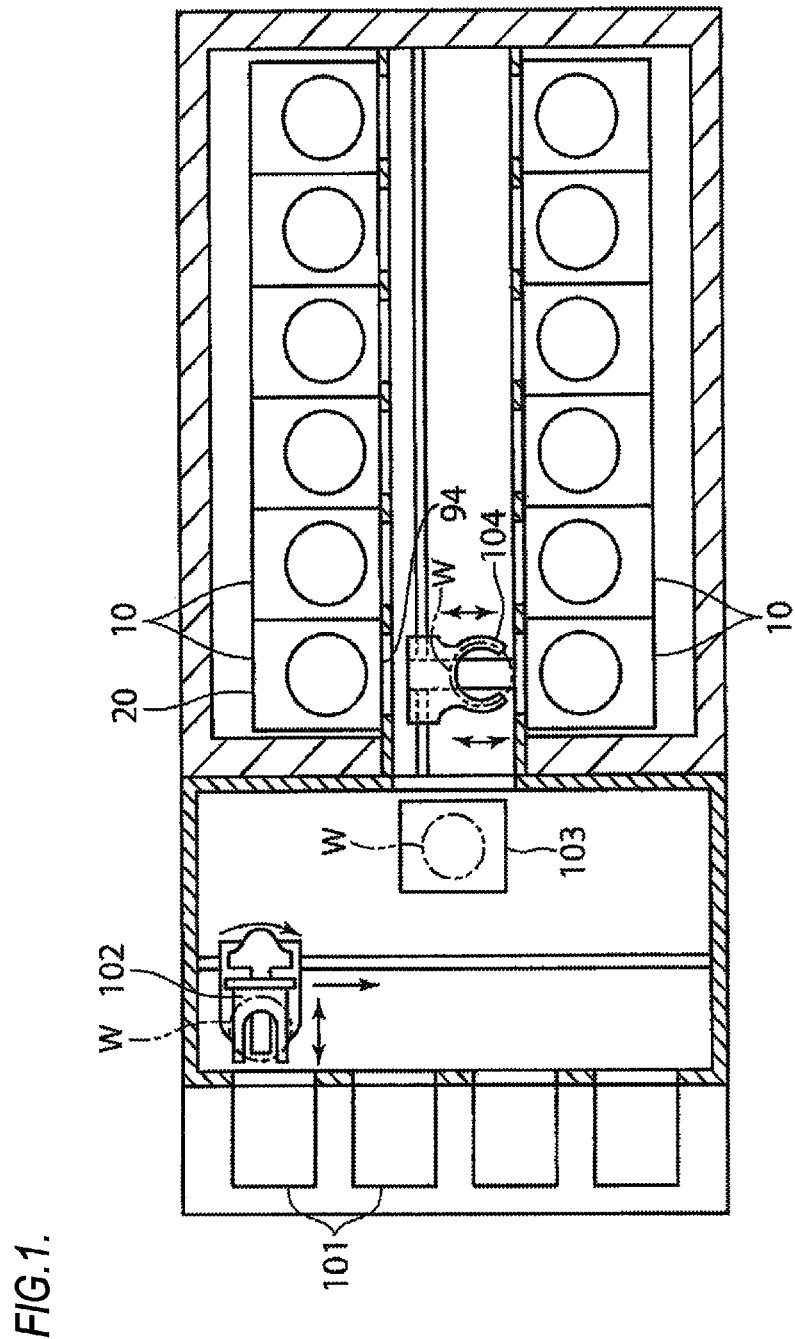
FIG. 1 is a plan view illustrating a liquid processing system including a liquid processing apparatus according to an exemplary embodiment of the present disclosure, when viewed from above.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a liquid processing apparatus and a liquid processing method that can reduce an entire processing time in the liquid processing including a process in which a first processing liquid is supplied to the wafer and another process in which a second processing liquid is supplied to the wafer.

A first exemplary embodiment of the present disclosure provides a liquid processing apparatus, which includes: a substrate holding unit holding a substrate within a processing space, a first nozzle configured to supply a first processing liquid to the substrate held in the substrate holding unit, a second nozzle configured to supply a second processing liquid to the substrate held in the substrate holding unit, a discharge mechanism capable of switching between a first discharge path and a second discharge path, and a control unit configured to control each of the substrate holding unit, the first nozzle, the second nozzle and the discharge mechanism, respectively. In particular, the control unit performs a first process that includes supplying the first processing liquid to the substrate held in the substrate holding unit and discharging the first processing liquid within the processing space from the first discharge path through the discharge mechanism, a second process, after the first process, that includes supplying the second processing liquid to the substrate held in the substrate holding unit and discharging the second processing liquid within the processing space from the second discharge path through the discharge mechanism, and after stop supplying of the first processing liquid and prior to beginning of the second process, a nozzle switching operation switching from the first nozzle to the second nozzle and a discharge mechanism switching operation switching from the first discharge path to the second discharge path. Further, the control unit determines a longer one of a time required to perform the nozzle switching operation and a time required to perform the discharge mechanism switching operation as a maximum preparation time, and begins the nozzle switching operation and the discharge mechanism switching operation at an earlier time than the completion time of the first process by the maximum preparation time or more.

In the liquid processing apparatus, the discharge mechanism is configured by a guide cup provided at an outer periphery of the substrate holding unit, and the guide cup may be moved between a first position at which the processing space is connected with the first discharge path and a second position at which the processing space is connected with the second discharge path.

Moreover, the liquid processing apparatus further includes a first exhaust mechanism and a second exhaust mechanism. The control unit operates to cause the first exhaust mechanism to exhaust a gas generated from the first processing liquid in the first process, operates to cause the second exhaust mechanism to exhaust a gas generated from the second processing liquid in the second process and, prior to beginning of the second process, performs an exhaust mechanism switching operation switching from the first exhaust mechanism to the second exhaust mechanism. Further, the control unit determines the longest one of a time required to perform the nozzle switching operation, a time required to perform the discharge mechanism switching operation and a time required to perform the exhaust mechanism switching operation as a maximum preparation time, and begins the nozzle switching operation, the discharge mechanism switching operation and the exhaust mechanism switching operation at an earlier time than the completion time of the first process by the maximum preparation time or more. Still further, the liquid processing apparatus further includes a switching valve switching between the first exhaust mechanism and the second exhaust mechanism.

A second exemplary embodiment of the present disclosure provides a liquid processing method, which includes: a first process that includes supplying a first processing liquid to a substrate held in a processing space from a first nozzle and discharging the first processing liquid within the processing space from a first discharge path through a discharge mechanism; after the first process, a second process that includes supplying a second processing liquid to the substrate held in the processing space from a second nozzle and discharging the second processing liquid within the processing space from a second discharge path through the discharge mechanism; and after stop supplying of the first processing liquid and prior to beginning of the second process, performing a nozzle switching operation from the first nozzle to the second nozzle and a discharge mechanism switching operation from the first discharge path to the second discharge path. Further, in the liquid processing method, a longer one of a time required to perform the nozzle switching operation and a time required to perform the discharge mechanism switching operation is determined as a maximum preparation time, and the nozzle switching operation and the discharge mechanism switching operation begin at an earlier time than the completion time of the first process by the maximum preparation time or more.

A third exemplary embodiment of the present disclosure provides a liquid processing method, which includes: a first process that includes supplying a first processing liquid to a substrate held in a processing space from a first nozzle, discharging the first processing liquid within the processing space from a first discharge path through a discharge mechanism and exhausting a gas generated from the first processing liquid through a first exhaust mechanism; after the first process, a second process that includes supplying a second processing liquid to the substrate held in the processing space from a second nozzle, discharging the second processing liquid within the processing space from a second discharge path through the discharge mechanism and exhausting a gas generated from the second processing liquid through a second exhaust mechanism; and after stop supplying of the first processing liquid and prior to beginning of the second process, performing a nozzle switching operation from the first nozzle to the second nozzle, a discharge mechanism switching operation from the first discharge path to the second discharge path and an exhaust mechanism switching operation from the first exhaust mechanism to the second exhaust mechanism. Further, in the liquid processing method, the longest one of a time required to perform the nozzle switching operation, a time required to perform the discharge mechanism switching operation and a time required to perform the exhaust mechanism switching operation is determined as a maximum preparation time, and the nozzle switching operation, the discharge mechanism switching operation and exhaust mechanism switching operation begin at an earlier time than the completion time of the first process by the maximum preparation time or more.

The liquid processing method further includes a third process of drying the substrate after the second process.

In the liquid processing method, the discharge mechanism switching operation is performed by moving the guide cup provided at an outer periphery of the substrate holding unit vertically between a position at which the processing space is connected with the first discharge path and another position at which the processing space is connected with the second discharge path.

In the liquid processing method, the first nozzle is provided at a first nozzle support arm and the second nozzle is provided at a second nozzle support arm. Further, during the nozzle switching operation, supplying of the first processing liquid from the first nozzle is stopped and the first nozzle support arm is retreated from above the substrate and the second nozzle support arm is disposed above the substrate.

In the liquid processing method, the first nozzle and the second nozzle are provided at a common nozzle support arm. Further, during the nozzle switching operation, supplying of the first processing liquid from the first nozzle is stopped and the nozzle support arm is moved to dispose the second nozzle at a supplying position of the second processing liquid.

In the liquid processing method, the first exhaust mechanism and the second exhaust mechanism are switchable by the switching valve.

A fourth exemplary embodiment of the present disclosure provides a non-transitory computer-readable storage medium having stored a computer executable program that, when executed, causes a computer to perform a liquid processing method comprising: a first process that includes supplying a first processing liquid to a substrate held in a processing space from a first nozzle and discharging the first processing liquid within the processing space from a first discharge path through a discharge mechanism; after the first process, a second process that includes supplying a second processing liquid to the substrate held in the processing space from a second nozzle and discharging the second processing liquid within the processing space from a second discharge path through the discharge mechanism; after stop supplying of the first processing liquid and prior to beginning of the second process, performing a nozzle switching operation from the first nozzle to the second nozzle and a discharge mechanism switching operation from the first discharge path to the second discharge path; and determining a longer one of a time required to perform the nozzle switching operation and a time required to perform the discharge mechanism switching operation as a maximum preparation time and beginning the nozzle switching operation and the discharge mechanism switching operation at an earlier time than the completion time of the first process by the maximum preparation time or more.

A fifth exemplary embodiment of the present disclosure provides a non-transitory computer-readable storage medium having stored a computer executable program that, when executed, causes a computer to perform a liquid processing method comprising: a first process that includes supplying a first processing liquid to a substrate held in a processing space from a first nozzle, discharging the first processing liquid within the processing space from a first discharge path through a discharge mechanism and exhausting a gas to be exhausted from the first processing liquid through a first exhaust mechanism; after the first process, a second process that includes supplying a second processing liquid to the substrate held in the processing space from a second nozzle, discharging the second processing liquid within the processing space from a second discharge path through the discharge mechanism and exhausting a gas to be exhausted from the second processing liquid through a second exhaust mechanism; after stop supplying of the first processing liquid and prior to beginning of the second process, performing a nozzle switching operation from the first nozzle to the second nozzle, a discharge mechanism switching operation from the first discharge path to the second discharge path and an exhaust mechanism switching operation from the first exhaust mechanism to the second exhaust mechanism; and determining the longest one of a time required to perform the nozzle switching operation, a time required to perform the discharge mechanism switching operation and a time required to perform the exhaust mechanism switching operation as a maximum preparation time, and beginning the nozzle switching operation, the discharge mechanism switching operation and exhaust mechanism switching operation at an earlier time than the completion time of the first process by the maximum preparation time or more.

According to the present disclosure, it is possible to sharply reduce an entire processing time of the liquid processing method.

Figure 2:
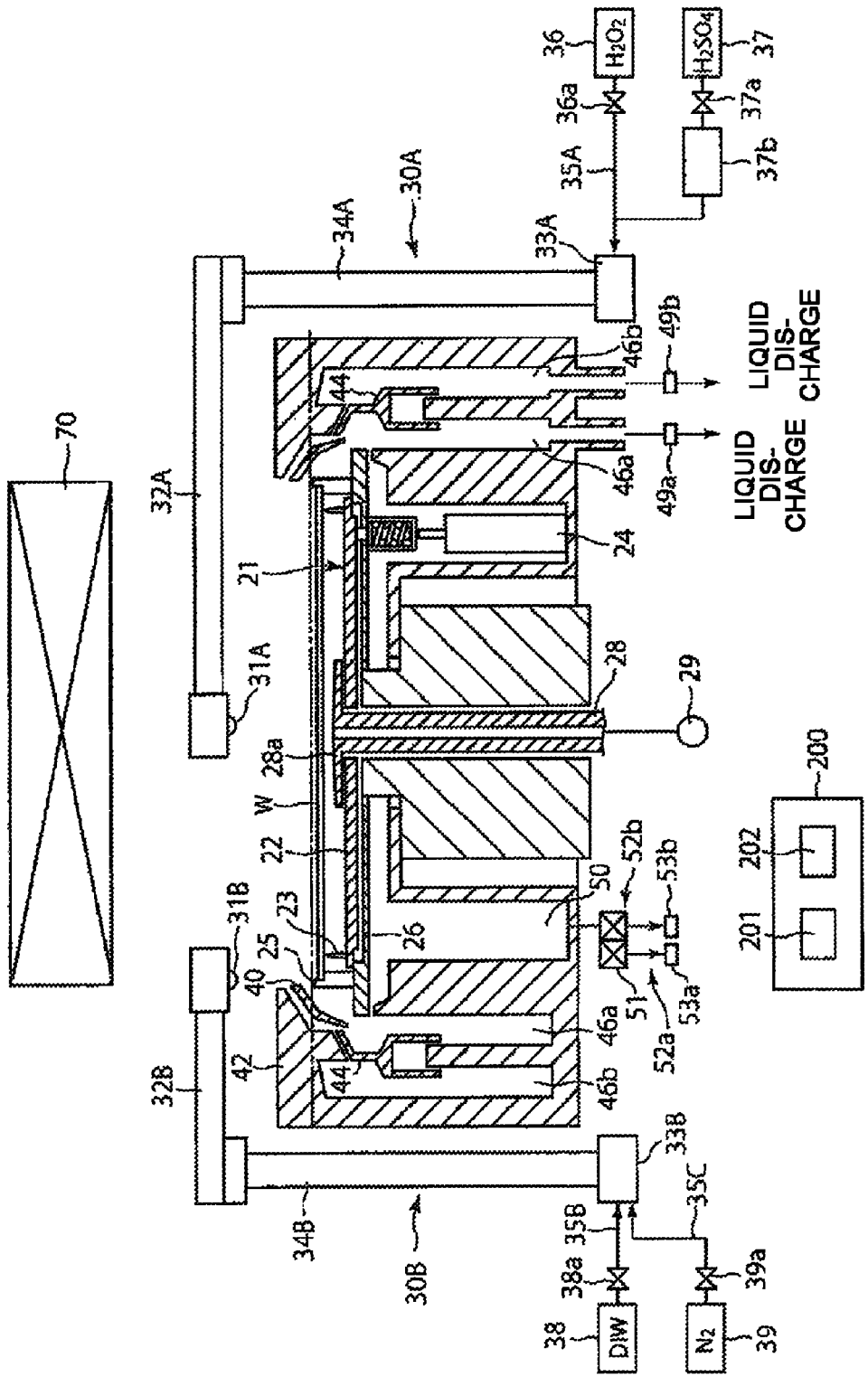
FIG. 2 is a longitudinal cross-sectional view illustrating a substrate holding unit and constitutional components provided near the substrate holding unit in the liquid processing apparatus.
Figure 3:
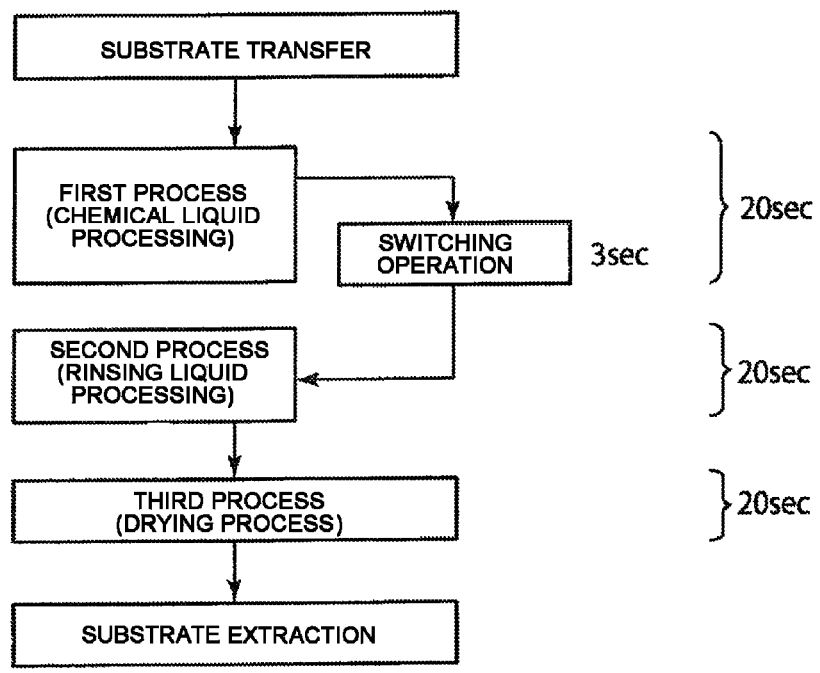
FIG. 3 is a flow chart illustrating a liquid processing method according to an exemplary embodiment of the present disclosure.

Hereinafter, an exemplary embodiment of the present disclosure will be described with reference to the accompanying drawings. FIG. 1 to FIG. 3 illustrate a liquid processing apparatus according to an exemplary embodiment of the present disclosure. More specifically, FIG. 1 is a plan view illustrating a liquid processing system including a liquid processing apparatus according to an exemplary embodiment of the present disclosure, when viewed from above. Further, FIG. 2 is a longitudinal cross-sectional view illustrating a substrate holding unit and components provided near the substrate holding unit in the liquid processing apparatus illustrated in FIG. 1, and FIG. 3 is a flow chart illustrating a liquid processing method according to an exemplary embodiment of the present disclosure.

First, the liquid processing system including the liquid processing apparatus according to the exemplary embodiment is described. As illustrated in FIG. 1, the liquid processing system includes a mounting table 101 configured to mount a carrier having accommodated a substrate (W) (hereinafter, also referred to as "wafer W") such as a semiconductor substrate therein as a substrate to be processed from outside, a transfer arm 102 configured to extract wafer W accommodated in the carrier, a shelf unit 103 configured to mount wafer W extracted by transfer arm 102 thereon, and a transfer arm 104 configured to receive wafer W mounted on shelf unit 103 and carry wafer W into an liquid processing apparatus 10. As illustrated in FIG. 1, a plurality of liquid processing apparatuses 10 (four liquid processing apparatuses in an aspect shown in FIG. 1) are provided in the liquid processing system.

Next, a schematic configuration of liquid processing apparatus 10 according to the exemplary embodiment will be described with reference to FIG. 2.

As illustrated in FIG. 2, liquid processing apparatus 10 according to the exemplary embodiment includes a chamber 20 in which wafer W is accommodated and a liquid processing is performed on wafer W, a substrate holding unit 21 provided in chamber 20 and configured to rotate wafer W while holding wafer W in a horizontal state, and a ring-shaped rotational cup 40 disposed around substrate holding unit 21. Ring-shaped rotational cup 40 is provided to receive a processing liquid having been supplied to wafer W during wafer W is subjected to a liquid processing.

Figure 5:
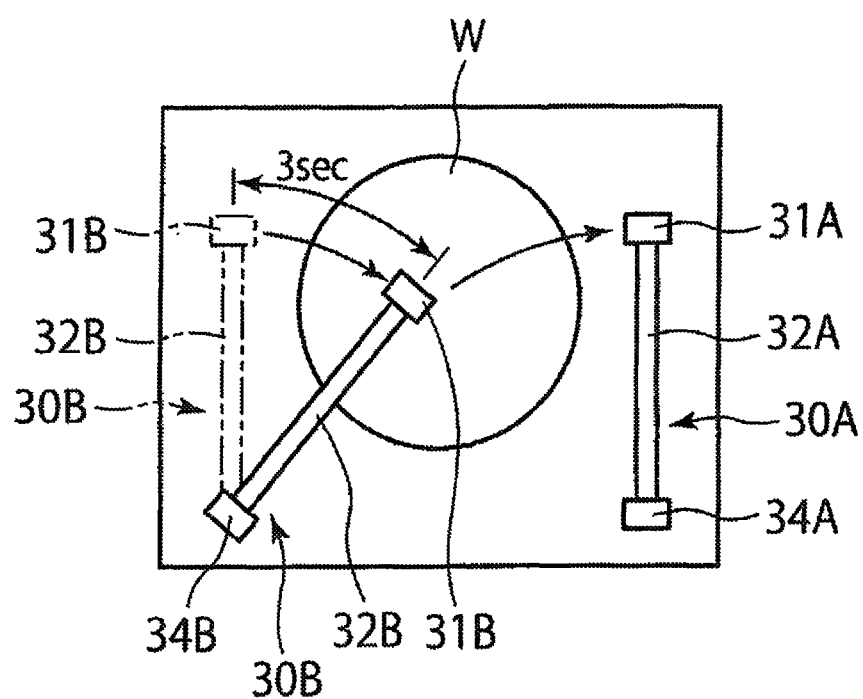
FIG. 5 is a plan view illustrating a chemical liquid supply mechanism and a rinsing liquid supply mechanism.

As illustrated in FIG. 2 and FIG. 5, liquid processing apparatus 10 includes a first nozzle 31A configured to supply a chemical liquid (e.g., SPM liquid) to wafer W held in substrate holding unit 21 from above and a nozzle support arm 32A supporting first nozzle 31A. A rotational shaft 34A supports nozzle support arm 32A and is rotated by a driving unit 33A.

A supply line 35A, provided with an opening/closing valve 36a and connected to a hydrogen peroxide ($H_2O_2$) supplying unit 36, is extended into nozzle support arm 32A.

Further, a supply line 35A is provided with a heater 37b and an opening/closing valve 37a, and is connected to a sulfuric acid ($H_2SO_4$) supplying unit 37.

A chemical liquid supply mechanism 30A is constituted with first nozzle 31A, nozzle support arm 32A, rotational shaft 34A and driving unit 33A, and is configured so that rotational shaft 34A is rotated by driving unit 33A to turn nozzle support arm 32A in a horizontal direction.

As illustrated in FIG. 2 and FIG. 5, liquid processing apparatus 10 includes a second nozzle 31B configured to supply a rinsing liquid (e.g., deionized water) to wafer W held in substrate holding unit 21 from above and a nozzle support arm 32B supporting second nozzle 31B. Nozzle support arm 32B is supported by a rotational shaft 34B and rotational shaft 34B is rotated by a driving unit 33B.

The supply lines 35B and 35C are extended into nozzle support arm 32B, and supply line 35B is provided with an opening/closing valve 38a and is connected to a deionized water supplying unit 38.

Further, a supply line 35C is provided with an opening/closing valve 39a and is connected to $N_2$ gas supplying unit 39.

A rinsing liquid supply mechanism 30B is constituted with second nozzle 31B, nozzle support arm 32B, rotational shaft 34B and driving unit 33B, and is configured so that rotational shaft 34B is rotated by driving unit 33B to turn nozzle support arm 32B in a horizontal direction.

In FIG. 2, nozzle support arm 32A of a chemical liquid supply mechanism 30A is rotated to make first nozzle 31A provided at a front end of nozzle support arm 32A to be positioned above the central part of wafer W. In this case, nozzle support arm 32B of rinsing liquid supply mechanism 30B has been retreated from wafer W, and second nozzle 31B provided at a front end of nozzle support arm 32B is located at a position spaced apart from wafer W.

As illustrated in FIG. 2, an air hood 70 is provided to cover wafer W held in substrate holding unit 21 from above. A purified gas such as $N_2$ gas (nitrogen gas) or clean air is allowed to flow downward from air hood 70.

Next, a description of the respective constitutional elements of liquid processing apparatus 10 will be described in detail.

As illustrated in FIG. 2, substrate holding unit 21 includes a disk-shaped holding plate 26 configured to hold wafer W and a disk-shaped lift pin plate 22 provided above holding plate 26. Three lift pins 23 supporting wafer W from below are provided on an upper surface of lift pin plate 22 at regular intervals in the circumferential direction. In FIG. 2, only two lift pins 23 are depicted. A piston mechanism 24 is provided below lift pin plate 22, and lift pin plate 22 is raised and lowered by piston mechanism 24. More specifically, when mounting wafer W on lift pin 23 or extracting wafer W from lift pin 23, lift pin plate 22 is moved by piston mechanism 24 from a position depicted in FIG. 2 upwardly to be located at a position upper than rotational cup 40. Meanwhile, when performing the liquid processing or drying on wafer W in chamber 20, lift pin plate 22 is moved to the descended position depicted in FIG. 2 by piston mechanism 24 to make rotational cup 40 to be positioned around wafer W.

Three holding members 25 supporting wafer W from a lateral side are provided on a holding plate 26 at regular intervals in the circumferential direction. In FIG. 2, only two holding members 25 are depicted. When lift pin plate 22 is moved from the ascended position to the descended position as depicted in FIG. 2, each holding member 25 supports wafer W disposed on lift pin 23 from the lateral side to slightly separate wafer W from lift pin 23.

Further, the respective through holes are formed at the central portions of lift pin plate 22 and holding plate 26 and a processing liquid supply pipe 28 is formed to pass through the through holes. Processing liquid supply pipe 28 is allowed to supply various types of processing liquids such as the chemical liquid or deionized water to the rear surface of wafer W held by the respective holding members 25 of holding plate 26. Further, processing liquid supply pipe 28 is raised and lowered in associating with lift pin plate 22. A head part 28a provided to close the through hole of lift pin plate 22 is formed on an upper end of processing liquid supply pipe 28. As illustrated in FIG. 2, a processing liquid supplying unit 29 is connected to processing liquid supply pipe 28, and various types of processing liquids are supplied to processing liquid supply pipe 28 by processing liquid supplying unit 29.

Ring-shaped rotational cup 40 is attached to holding plate 26 as described above to cause ring-shaped rotational cup 40 to be integrally rotated with holding plate 26 by a connection part (not shown). Ring-shaped rotational cup 40, as illustrated in FIG. 2, is provided to surround wafer W, which is supported by the respective holding members 25 of holding plate 26, from a lateral side. Therefore, ring-shaped rotational cup 40 is allowed to receive the processing liquid dispersed from wafer W during wafer W is subjected to a liquid processing.

Figure 4:
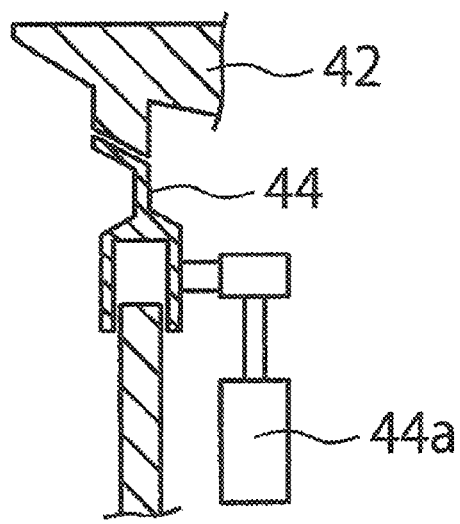
FIGS. 4A and 4B are views illustrating a guide cup and a elevating cylinder, respectively.
Figure 4:
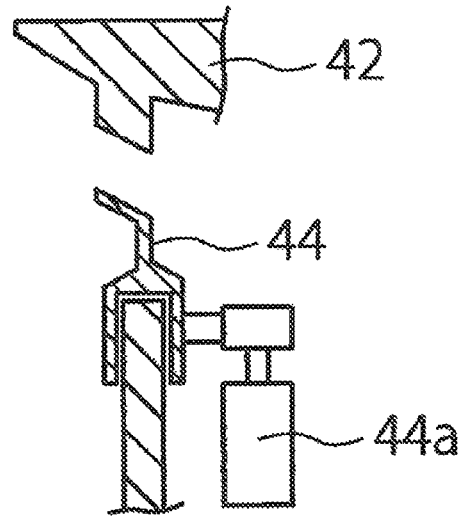

Further, a drain cup 42 and a guide cup 44 are provided around rotational cup 40, respectively. Drain cup 42 and a guide cup 44 are formed in a ring shape and provided with openings at upper parts thereof, respectively. Here, the position of drain cup 42 is fixed with respect to substrate holding unit 21. Meanwhile, as illustrated in FIGS. 4A and 4B, guide cup 44 is connected to an elevation cylinder 44a which raises and lowers down guide cup 44. Further, guide cup 44 guides the processing liquid to drain cup 42, and serves as a discharge mechanism which performs a switching between first discharge path 46a and second discharge path 46b.

As illustrated in FIG. 2, a first discharge path 46a and a second discharge path 46b are provided below a drain cup 42 and a guide cup 44, respectively. Liquid dispersed to the lateral side from wafer W during wafer W is subjected to a liquid processing is selectively sent to any one of discharge paths 46a and 46b based on the type of the processing liquids depending on a position of guide cup 44 in a vertical direction. Specifically, when guide cup 44 is located at the descended position, a predetermined liquid, for example, the rinsing liquid to be describes below, dispersed laterally from wafer W is sent to second discharge path 46b. Meanwhile, when guide cup 44 is located at the ascended position, a predetermined liquid, for example, the SPM liquid to be described below, dispersed laterally from wafer W is sent to first discharge path 46a. Further, as illustrated in FIG. 2, a liquid discharge pump 49a and a liquid discharge pump 49b are connected to first discharge path 46a and a second discharge path 46b, respectively. An exhaust path 50 through which a gas generated from the processing liquid guided by rotational cup 40 is passed is formed in an inner side of first discharge path 46a, and the gas exhausted from exhaust path 50 is sent to either a first exhaust mechanism 52a having an exhaust pump 53a or a second exhaust mechanism 52b having an exhaust pump 53b through a switching valve 51.

In this case, both liquid discharged from liquid discharge pumps 49a and 49b and gas exhausted from exhaust pumps 53a and 53b are sent to processing facilities in the manufacturing factory to be properly processed.

Meanwhile, first nozzle 31A supported on nozzle support arm 32A is formed to be oriented downward, and the SPM liquid obtained by mixing sulphuric acid and hydrogen peroxide is ejected downwardly toward wafer W from first nozzle 31A of nozzle support arm 32A. As described above, supply line 35A extending into rotational shaft 34A and nozzle support arm 32A is connected to first nozzle 31A, and $H_2O_2$ supplying unit 36 and $H_2SO_4$ supplying unit 37 provided in parallel with each other are connected to supply line 35A through opening/closing valve 36a and opening/closing valve 37a, respectively. Further, a heater 37b for heating the sulphuric acid supplied from $H_2SO_4$ supplying unit 37 has been provided. The hydrogen peroxide and sulphuric acid supplied from $H_2O_2$ supplying unit 36 and $H_2SO_4$ supplying unit 37 are mixed, and the SPM liquid obtained by mixing hydrogen peroxide and sulphuric acid is allowed to be sent to first nozzle 31A formed at the front end of nozzle support arm 32A through supply line 35A. The sulphuric acid supplied from $H_2SO_4$ supplying unit 37 is heated by heater 37b, and heat of reaction is generated by the chemical reaction of mixing sulphuric acid and the hydrogen peroxide. By doing this, the temperature of the SPM liquid ejected from first nozzle 31A becomes a high temperature of, for example, 100° C. or more, preferably about 170° C.

In FIG. 2, second nozzle 31B of rinsing liquid supply mechanism 30B is formed to be oriented downward. More specifically, the respective supply line 35B and supply line 35C that extend into rotational shaft 34B and nozzle support arm 32B are connected to second nozzle 31B and a deionized water supplying part 38 is connected to supply line 35B. The deionized water supplied from deionized water supplying part 38 through supply line 35B is supplied toward wafer W downwardly.

As illustrated in FIG. 2, liquid processing apparatus 10 includes a controller (control unit) 200 which comprehensively manages and controls the entire operation of the liquid processing apparatus. Controller 200 controls the operations of functional components of liquid processing apparatus such as for example, piston mechanism 24, driving units 33A, 33B, elevation cylinder 44a, liquid discharge pumps 49a, 49b, gas exhaust pumps 53a, 53b, switching valve 51, and opening/closing valves 36a, 37a, 38a, 39a. Controller 200 may be implemented with hardware, such as for example, a general computer, and software, such as for example, programs (device control program and process recipe) capable of operating the computer. The software is stored in a storage medium such as a hard disk drive, which is fixedly provided on computer, or storage medium such as CD-ROM, DVD, and a flash memory, which is detachably set to the computer. The storage medium is denoted by reference numeral 201 in FIG. 2. A processor 202 calls a predetermined process recipe from a storage medium 201 to be executed based on instruction from a user interface (not shown) as needed, such that the respective functional components of liquid processing apparatus 10 are operated to perform a predetermined process under control of controller 200. Controller 200 may be a system controller controlling the entire liquid processing system illustrated in FIG. 1.

Next, an operation of the exemplary embodiment having a configuration described above will be described. Specifically, a series of processes of cleaning process which remove an unnecessary resist film formed on an upper surface of wafer W will be described with reference to FIG. 3. Controller 200 controls the respective functional components of liquid processing apparatus 10 to perform the series of processes of cleaning process to be described below.

First of all, first nozzle 31A and second nozzle 31B are brought to a retreat position retreated from above wafer W. Further, guide cup 44 is raised by elevation cylinder 44a and brought to an ascended position (first position) (see FIG. 4A). In this case, guide cup 44 serves as a discharge mechanism switching between first discharge path 46a and second discharge path 46b. Under the circumstance, lift pin plate 22 and processing liquid supply pipe 28 in the substrate holding unit 21 are moved from a position indicated in FIG. 2 upwardly, and an opening 94 of chamber 20 is open (FIG. 1). Wafer W is carried into chamber 20 through opening 94 by transfer arm 104 from outside liquid processing apparatus 10 and disposed on a lift pin 23 of lift pin plate 22, and thereafter, transfer arm 104 is retreated from chamber 20. Further, gas such as clean air is sent from air hood 70 into chamber 20 in a down-flow mode at all times, and the gas is exhausted to substitute an atmosphere within chamber 20.

Next, lift pin plate 22 and processing liquid supply pipe 28 are moved downwardly to be located at the descended position as depicted in FIG. 2. In this case, the respective holding members 25 provided on holding plate 26 support wafer W disposed on lift pin 23 from a lateral side and separate wafer W slightly from lift pin 23.

Thereafter, holding plate 26 and lift pin plate 22 in substrate holding unit 21 are rotated. By doing this, wafer W supported by the respective holding members 25 of holding plate 26 is also rotated.

Next, driving unit 33A turns nozzle support arm 32A in a horizontal direction to bring first nozzle 31A above the central portion of wafer W.

While wafer W is being rotated, the SPM liquid (first processing liquid) is supplied from first nozzle 31A positioned above the central portion of wafer W to the upper surface of wafer W. Herein, the temperature of the SPM liquid supplied to the upper surface of wafer W is a high temperature of, for example, 100° C. or more, preferably about 170° C. By doing this, the SPM liquid is supplied to the upper surface of wafer W to make wafer W to be subjected to a SPM liquid processing (first process).

Through the liquid process, resist formed on a surface of wafer W is stripped by the SPM liquid, and the stripped resist is sent to first discharge path 46a together with the SPM liquid to be recovered by a centrifugal force of wafer W being rotated. Specifically, when the SPM liquid processing is performed on wafer W as described above, guide cup 44 is located at the ascended position, such that the SPM liquid (including the stripped resist) is sent to first discharge path 46a by rotational cup 40 and guide cup 44 to be recovered. The SPM liquid sent to first discharge path 46a is discharged outside from liquid discharge pump 49a. During the SPM liquid discharging, gas containing the moisture component of the SPM liquid is guided to exhaust path 50 to be exhausted. The gas within exhaust path 50 to be exhausted is sent to first gas exhaust mechanism 52a by switching valve 51 and exhausted outside by gas exhaust pump 53a of first gas exhaust mechanism 52a.

Thereafter, as will be described below, when the SPM liquid processing for wafer W is completed, the rinsing liquid processing (second process) in which the rinsing liquid (second processing liquid) is supplied to wafer W using second nozzle 31B is performed.

In the second process, guide cup (discharge mechanism) 44 is lowered to be located at the descended position (second position), and the discharge path needs to be switched from first discharge path 46a to second discharge path 46b. Further, exhaust pump 53b of second exhaust mechanism 52b needs to be driven with switching the discharge mechanism from first exhaust mechanism 52a to second exhaust mechanism 52b by switching valve 51 and stopping exhaust pump 53a of first exhaust mechanism 52a.

That is, before the rinsing liquid processing (second process) for wafer W is started, the following three operations need to be performed including a nozzle switching operation of switching from first nozzle 31A to second nozzle 31B, a discharge mechanism switching operation of lowering guide cup (discharge mechanism) 44 from the first position and bringing guide cup 44 to the second position by elevation cylinder 44a, and an exhaust mechanism switching operation of switching from first exhaust mechanism 52a to second exhaust mechanism 52b by switching valve 51.

In the present disclosure, the nozzle switching operation of switching from first nozzle 31A to second nozzle 31B, the guide cup 44 switching operation, and the exhaust mechanism switching operation of switching from first exhaust mechanism 52a to second exhaust mechanism 52b by switching valve 51 are completed during the first process, specifically, until the first process is completed, thereby aiming to reduce the entire processing time.

Next, descriptions will be made regarding the respective switching operations performed until the first process is completed.

Nozzle Switching Operation

When switching from first nozzle 31A to second nozzle 31B, opening/closing valve 36a is closed first, and heater 37b is stopped. Next, rotational shaft 34A is rotated by driving unit 33A of chemical liquid supply mechanism 30A to turn nozzle support arm 32A in a horizontal direction and first nozzle 31A is retreated from above wafer W.

Thereafter, rotational shaft 34B is rotated by driving unit 33B of rinsing liquid supply mechanism 30B to turn nozzle support arm 32B in a horizontal direction and second nozzle 31B is disposed above the central portion of wafer W (see FIG. 5).

Next, opening/closing valves 38a and 39a are opened and the rinsing liquid is supplied to wafer W from second nozzle 31B.

Discharge Mechanism Switching Operation

Guide cup 44 is lowered by elevation cylinder 44a to be located on the descended position from the ascended position (see FIG. 4A), thereby performing switching from first discharge path 46a to second discharge path 46b.

Exhaust Mechanism Switching Operation

The switching from first exhaust mechanism 52a having an exhaust pump 53a to a second exhaust mechanism 52b having an exhaust pump 53b by a switching valve 51 is performed.

In the present disclosure, a longest time among the times required to perform the respective switching operations is determined as a maximum preparation time.

Specifically, when it takes three seconds to perform nozzle switching operation and it takes two seconds to perform each of discharge mechanism switching operation and exhaust mechanism switching operation, respectively, three seconds required for nozzle switching operation is determined as the maximum preparation time.

When it takes twenty seconds to perform the first process and it also takes twenty seconds to perform the second process, the nozzle switching operation, the discharge mechanism switching operation and the exhaust mechanism switching operation begin at an earlier time than the completion time of the first process by the maximum preparation time or more.

By doing this, all of the nozzle switching operation, the discharge mechanism switching operation and the exhaust mechanism switching operations may be completed until the completion of the first process.

Therefore, it is possible to continuously perform the first process and the second process, such that an additional time for the switching operation between the first process and the second process is not required.

Therefore, it is possible to reduce an overall processing time.

After completion of the respective switching operations as described above, the second process begins. In the second process, the deionized water is supplied to wafer W by second nozzle 31B while wafer W is being rotated to perform the rinsing liquid processing on wafer W.

The rinsing liquid supplied to wafer W is sent to second discharge path 46b passing through guide cup 44, and the rinsing liquid from second discharge path 46b is discharged outwardly by liquid discharge pump 49b. During the discharging, gas generated from the rinsing liquid is guided into exhaust path 50, gas exhausted from exhaust path 50 is sent to second exhaust mechanism 52b by switching valve 51 and exhausted outside by exhaust pump 53b of second exhaust mechanism 52b.

After completion of the second process, wafer W is rotated with a high speed to blow off rinsing liquid remained thereon to dry wafer W.

By doing this, the drying process (third process) for wafer W is performed as described above.

When the drying process for wafer W is completed, lift pin plate 22 and processing liquid supply pipe 28 in substrate holding unit 21 are moved from the position indicated in FIG. 2 upwardly, and an opening 94 of chamber 20 is open. Then, transfer arm 104 enters into chamber 20 from outside of liquid processing apparatus 10 through opening 94 and wafer W disposed on lift pin 23 of lift pin plate 22 is transferred by transfer arm 104. Thereafter, wafer W extracted by transfer arm 104 is carried outside of liquid processing apparatus 10. By doing this, a series processes for liquid processing of wafer W are performed as described above.

As described above, according to the exemplary embodiment, the longest time of a time required to perform the nozzle switching operation, a time required to perform the discharge mechanism switching operation and a time required to perform the exhaust mechanism switching operation is determined as a maximum preparation time, and all of the switching operations begin at an earlier time than the completion time of the first process by the maximum preparation time. Therefore, all of the switching operations can be completed until the first process is completed, such that an overall processing time can be reduced.

Further, the series of processes of the cleaning process are performed according to the recipe prepared in advance. In this case, the following matters are digitized and input in the process recipe: a nozzle to be selected for supplying the processing liquid on wafer W; kinds of the processing liquid to be supplied on wafer W through the nozzle; a specific place on wafer W to which the processing liquid to be supplied; the time in seconds during which the processing liquid is supplied; a discharge path to which the processing liquid should be discharged; and an exhaust path to which the exhausted gas should be sent. Controller 200 recognizes the switching operation necessary for the first process and the second process from the prepared recipe. Among the time required to perform the cleaning process, since all of the switching operations can be completed until the first process is completed, it is possible to make a set time specified on the recipe and the actual processing time to be equivalent to each other. Therefore, it is possible to accurately grasp the entire processing performance of the liquid processing apparatus.

In the exemplary embodiment described above, an example is described in which the SPM liquid is used as the first processing liquid in the first process and the rinsing liquid is used as the second processing liquid in the second process. However, the exemplary embodiment is not limited thereto, and another chemical liquid other than the SPM liquid may be used as the first processing liquid and the rinsing liquid may be used as the second processing liquid, respectively.

Further, another example in which the rinsing liquid may be used as the first processing liquid and a chemical liquid (including the SPM liquid) may be used as the second processing liquid may be embodied.

Since the chemical liquid and the rinsing liquid do not react with each other in any of the examples, there is no case where a crystalline particle is generated.

Next, a modified example of the present disclosure will be described.

In the exemplary embodiment described above, an example is described in which first nozzle 31A is provided on the front end of nozzle support arm 32A and second nozzle 31B is provided on the front end of nozzle support arm 32B. However, the exemplary embodiment is not limited thereto, and first nozzle 31A and second nozzle 31B may be supported by the same nozzle support arm.

In this case, the nozzle switching operation between first nozzle 31A and second nozzle 31B is performed by turning the nozzle support arm.

In the exemplary embodiment described above, an example is described in which all of the switching operations begin at an earlier time than the completion time of the first process by the maximum preparation time. However, only the nozzle switching operation requiring the maximum preparation time (three seconds) may begin at an earlier time than the completion time of the first process by the maximum preparation time, and the discharge mechanism switching operation (two seconds) and the exhaust mechanism switching operation (two seconds) may be performed at a time one second elapse thereafter, such that all of the switching operations may be completed simultaneously at a completion time of the first process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
   a substrate holding unit holding a substrate within a processing space;
   a first nozzle configured to supply a first processing liquid to the substrate held in the substrate holding unit;
   a second nozzle configured to supply a second processing liquid to the substrate held in the substrate holding unit;
   a discharge mechanism including a guide cup provided at an outer periphery of the substrate holding unit and capable of being switched between a first discharge path and a second discharge path, the guide cup being configured to move between a first position at which the processing space is connected with the first discharge path and a second position at which the processing space is connected with the second discharge path; and
   a control unit configured to control each of the substrate holding unit, the first nozzle, the second nozzle and the discharge mechanism, respectively,
   wherein the control unit is programmed to perform a first process that includes supplying the first processing liquid to the substrate held in the substrate holding unit and discharging the first processing liquid within the processing space from the first discharge path through the discharge mechanism, a second process, after the first process, that includes supplying the second processing liquid to the substrate held in the substrate holding unit and discharging the second processing liquid within the processing space from the second discharge path through the discharge mechanism, and after stop supplying of the first processing liquid in the first process and prior to beginning of the second process, a nozzle switching operation from the first nozzle to the second nozzle and a discharge mechanism switching operation from the first discharge path to the second discharge path,
   the control unit is further programmed to determine a longer one of a time required to perform the nozzle switching operation and a time required to perform the discharge mechanism switching operation as a maximum preparation time and begin the nozzle switching operation and the discharge mechanism switching operation at an earlier time than the completion time of the first process by the maximum preparation time or more such that both of the nozzle switching operation and the discharge mechanism switching operation are completed within the first process before the second processing liquid is supplied from the second nozzle in the second process, and
   the control unit is also programmed to dispose the guide cup at the first position in the first process and at the second position in the second process, and initiate moving the guide cup from the first position to the second position while the first process is being performed and complete moving the guide cup from the first position to the second position before the second process begins.

2. The liquid processing apparatus of claim 1, further comprising a first exhaust mechanism and a second exhaust mechanism,
   wherein the control unit operates to make the first exhaust mechanism to exhaust a gas generated from the first processing liquid in the first process, operates to make the second exhaust mechanism to exhaust a gas generated from the second processing liquid in the second process, and prior to beginning of the second process, performs an exhaust mechanism switching operation from the first exhaust mechanism to the second exhaust mechanism, and,
   the control unit determines the longest one of a time required to perform the nozzle switching operation, a time required to perform the discharge mechanism switching operation and a time required to perform the exhaust mechanism switching operation as a maximum preparation time, and begins the nozzle switching operation, the discharge mechanism switching operation and the exhaust mechanism switching operation at an earlier time than the completion time of the first process by the maximum preparation time or more.

3. The liquid processing apparatus of claim 2, further comprising switching a valve switching between the first exhaust mechanism and the second exhaust mechanism.

4. A liquid processing method, comprising:
   a first process that includes supplying a first processing liquid to a substrate held on a substrate holding unit in a processing space from a first nozzle and discharging the first processing liquid within the processing space from a first discharge path through a discharge mechanism;
   after the first process, a second process that includes supplying a second processing liquid to the substrate held on the substrate holding unit in the processing space from a second nozzle and discharging the second processing liquid within the processing space from a second discharge path through the discharge mechanism;

after stop supplying of the first processing liquid in the first process and prior to beginning of the second process, performing a nozzle switching operation from the first nozzle to the second nozzle and a discharge mechanism switching operation from the first discharge path to the second discharge path; and determining a longer one of a time required to perform the nozzle switching operation and a time required to perform the discharge mechanism switching operation as a maximum preparation time, and beginning the nozzle switching operation and the discharge mechanism switching operation at an earlier time than the completion time of the first process by the maximum preparation time or more such that both of the nozzle switching operation and the discharge mechanism switching operation are completed within the first process before the second processing liquid from the second nozzle is supplied in the second process, wherein the discharge mechanism includes a guide cup provided at an outer periphery of the substrate holding unit and is capable of being switched between the first discharge path and the second discharge path by moving between a first position at which the processing space is connected with the first discharge path and a second position at which the processing space is connected with the second discharge path, and the guide cup is disposed at the first position in the first process and at the second position in the second process, and initiated to be moved from the first position to the second position while the first process is being performed and completed moving from the first position to the second position before the second process begins.

5. The liquid processing method of claim 4, further comprising a third process of drying the substrate after the second process.

6. The liquid processing method of claim 4, wherein the discharge mechanism switching operation is performed by moving the guide cup provided at outer periphery of the substrate holding unit vertically between a position at which the processing space is connected with the first discharge path and another position at which the processing space is connected with the second discharge path.

7. The liquid processing method of claim 4, wherein the first nozzle is provided at a first nozzle support arm and the second nozzle is provided at a second nozzle support arm, and during the nozzle switching operation, supplying of the first processing liquid from the first nozzle is stopped and the first nozzle support arm is retreated from above the substrate and the second nozzle support arm is disposed above the substrate.

8. The liquid processing method of claim 4, wherein the first nozzle and the second nozzle are provided at a common nozzle support arm, and during the nozzle switching operation, supplying of the first processing liquid from the first nozzle is stopped and the nozzle support arm is moved to dispose the second nozzle at a supplying position of the second processing liquid.

9. A liquid processing method, comprising:

a first process that includes supplying a first processing liquid to a substrate held in a processing space from a first nozzle, discharging the first processing liquid within the processing space from a first discharge path through a discharge mechanism and exhausting a gas generated from the first processing liquid through a first exhaust mechanism;

after the first process, a second process that includes supplying a second processing liquid to the substrate held in the processing space from a second nozzle, discharging the second processing liquid within the processing space from a second discharge path through the discharge mechanism and exhausting a gas generated from the second processing liquid through a second exhaust mechanism;

after stop supplying of the first processing liquid in the first process and prior to beginning of the second process, performing a nozzle switching operation from the first nozzle to the second nozzle, a discharge mechanism switching operation from the first discharge path to the second discharge path and an exhaust mechanism switching operation from the first exhaust mechanism to the second exhaust mechanism; and determining a longest one of a time required to perform the nozzle switching operation, a time required to perform the discharge mechanism switching operation and a time required to perform the exhaust mechanism switching operation as a maximum preparation time, and beginning the nozzle switching operation, the discharge mechanism switching operation and the exhaust mechanism switching operation at an earlier time than the completion time of the first process by the maximum preparation time or more such that all of the nozzle switching operation, the discharge mechanism switching operation and the exhaust mechanism switching operation are completed within the first process before the second processing liquid from the second nozzle is supplied in the second process, wherein the discharge mechanism includes a guide cup provided at an outer periphery of the substrate holding unit and is capable of being switched between the first discharge path and the second discharge path by moving between a first position at which the processing space is connected with the first discharge path and a second position at which the processing space is connected with the second discharge path, and the guide cup is disposed at the first position in the first process and at the second position in the second process, and initiated to be moved from the first position to the second position while the first process is being performed and completed moving from the first position to the second position before the second process begins.

10. A non-transitory computer-readable storage medium having stored therein a computer executable program that, when executed, causes a computer to perform a liquid processing method comprising:

a first process that includes supplying a first processing liquid to a substrate held in a processing space from a first nozzle and discharging the first processing liquid within the processing space from a first discharge path through a discharge mechanism;

after the first process, a second process that includes supplying a second processing liquid to the substrate held in the processing space from a second nozzle and discharging the second processing liquid within the processing space from a second discharge path through the discharge mechanism;

after stop supplying of the first processing liquid in the first process and prior to beginning of the second process, performing a nozzle switching operation from the first nozzle to the second nozzle and a discharge mechanism switching operation from the first discharge path to the second discharge path; and determining a longer one of a time required to perform the nozzle switching operation and a time required to perform the discharge mechanism switching operation as a maximum preparation time, and beginning the nozzle switching operation and the discharge mechanism switching operation at an earlier time than the completion time of the first process by the maximum preparation time or more such that both of the nozzle switching operation and the discharge mechanism switching operation are completed within the first process before the second processing liquid from the second nozzle is supplied in the second process, wherein the discharge mechanism includes a guide cup provided at an outer periphery of the substrate holding unit and is capable of being switched between the first discharge path and the second discharge path by moving between a first position at which the processing space is connected with the first discharge path and a second position at which the processing space is connected with the second discharge path, and the guide cup is disposed at the first position in the first process and at the second position in the second process, and initiated to be moved from the first position to the second position while the first process is being performed and completed moving from the first position to the second position before the second process begins.

11. A non-transitory computer-readable storage medium having stored therein a computer executable program that, when executed, causes a computer to perform a liquid processing method comprising:

a first process that includes supplying a first processing liquid to a substrate held in a processing space from a first nozzle, discharging the first processing liquid within the processing space from a first discharge path through a discharge mechanism and exhausting a gas generated from the first processing liquid through a first exhaust mechanism;

after the first process, a second process that includes supplying a second processing liquid to the substrate held in the processing space from a second nozzle, discharging the second processing liquid within the processing space from a second discharge path through the discharge mechanism, and exhausting a gas generated from the second processing liquid through a second exhaust mechanism;

after stop supplying of the first processing liquid in the first process and prior to beginning of the second process, performing a nozzle switching operation from the first nozzle to the second nozzle, a discharge mechanism switching operation from the first discharge path to the second discharge path, and an exhaust mechanism switching operation from the first exhaust mechanism to the second exhaust mechanism; and determining the longest one of a time required to perform the nozzle switching operation, a time required to perform the discharge mechanism switching operation and a time required to perform the exhaust mechanism switching operation as a maximum preparation time, and beginning the nozzle switching operation, the discharge mechanism switching operation and exhaust mechanism switching operation at an earlier time than the completion time of the first process by the maximum preparation time or more such that all of the nozzle switching operation, the discharge mechanism switching operation and the exhaust mechanism switching operation are completed within the first process before the second processing liquid from the second nozzle is supplied in the second process, wherein the discharge mechanism includes a guide cup provided at an outer periphery of the substrate holding unit and is capable of being switched between the first discharge path and the second discharge path by moving between a first position at which the processing space is connected with the first discharge path and a second position at which the processing space is connected with the second discharge path, and the guide cup is disposed at the first position in the first process and at the second position in the second process, and initiated to be moved from the first position to the second position while the first process is being performed and completed moving from the first position to the second position before the second process begins.

* * * * *